United States Patent
Lee et al.

(10) Patent No.: US 11,444,028 B2
(45) Date of Patent: *Sep. 13, 2022

(54) CONTACT STRUCTURE AND FORMATION THEREOF

(71) Applicant: TAIWAN SEMICONDUCTOR MANUFACTURING COMPANY LIMITED, Hsin-Chu (TW)

(72) Inventors: Hong-Mao Lee, Hsinchu (TW); Huicheng Chang, Tainan (TW); Chia-Han Lai, Zhubei (TW); Chi-Hsuan Ni, Chupei (TW); Cheng-Tung Lin, Jhudong Township (TW); Huang-Yi Huang, Hsin-Chu (TW); Chi-Yuan Chen, Hsinchu (TW); Li-Ting Wang, Hsinchu (TW); Teng-Chun Tsai, Hsinchu (TW); Wei-Jung Lin, Hsinchu (TW)

(73) Assignee: TAIWAN SEMICONDUCTOR MANUFACTURING COMPANY Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/716,441

(22) Filed: Dec. 16, 2019

(65) Prior Publication Data
US 2020/0118935 A1  Apr. 16, 2020

Related U.S. Application Data

(60) Division of application No. 15/675,967, filed on Aug. 14, 2017, now Pat. No. 10,510,664, which is a
(Continued)

(51) Int. Cl.
*H01L 23/485* (2006.01)
*H01L 23/532* (2006.01)
(Continued)

(52) U.S. Cl.
CPC .. *H01L 23/53209* (2013.01); *H01L 21/28518* (2013.01); *H01L 21/76843* (2013.01);
(Continued)

(58) Field of Classification Search
CPC ............ H01L 23/53209; H01L 23/485; H01L 23/528; H01L 23/53226; H01L 23/5226;
(Continued)

(56) References Cited

U.S. PATENT DOCUMENTS

| 8,187,970 B2 * | 5/2012 | Ganguli | ............ C23C 16/45523 438/655 |
| 2002/0090576 A1 * | 7/2002 | Tu | ..................... H01L 21/76808 430/311 |

(Continued)

*Primary Examiner* — Timor Karimy
(74) *Attorney, Agent, or Firm* — Cooper Legal Group, LLC

(57) ABSTRACT

A semiconductor device and methods of formation are provided. A semiconductor device includes an annealed cobalt plug over a silicide in a first opening of the semiconductor device, wherein the annealed cobalt plug has a repaired lattice structure. The annealed cobalt plug is formed by annealing a cobalt plug at a first temperature for a first duration, while exposing the cobalt plug to a first gas. The repaired lattice structure of the annealed cobalt plug is more regular or homogenized as compared to a cobalt plug that is not so annealed, such that the annealed cobalt plug has a relatively increased conductivity or reduced resistivity.

20 Claims, 18 Drawing Sheets

Related U.S. Application Data continuation of application No. 15/059,652, filed on Mar. 3, 2016, now Pat. No. 9,735,107, which is a division of application No. 14/091,508, filed on Nov. 27, 2013, now Pat. No. 9,287,170.

(51) Int. Cl.
*H01L 21/768* (2006.01)
*H01L 21/285* (2006.01)
*H01L 23/522* (2006.01)
*H01L 23/528* (2006.01)

(52) U.S. Cl.
CPC .. *H01L 21/76864* (2013.01); *H01L 21/76867* (2013.01); *H01L 21/76883* (2013.01); *H01L 23/485* (2013.01); *H01L 23/528* (2013.01); *H01L 23/5226* (2013.01); *H01L 23/53266* (2013.01); *H01L 21/76855* (2013.01); *H01L 2924/0002* (2013.01)

(58) Field of Classification Search
CPC ....... H01L 2924/0002; H01L 21/28518; H01L 21/76864; H01L 21/76867; H01L 21/76883; H01L 21/76855; H01L 21/76843; H01L 23/48; H01L 23/52; H01L 23/40
See application file for complete search history.

(56) References Cited

U.S. PATENT DOCUMENTS

| | | | |
|---|---|---|---|
| 2004/0043601 A1* | 3/2004 | Park | H01L 21/28556 438/629 |
| 2013/0260555 A1 | 10/2013 | Zope et al. | |
| 2014/0183738 A1* | 7/2014 | Jezewski | H01L 21/76871 257/751 |

* cited by examiner

CONTACT STRUCTURE AND FORMATION THEREOF

RELATED APPLICATION

This application is a divisional of and claims priority to U.S. patent application Ser. No. 15/675,967, titled "CONTACT STRUCTURE AND FORMATION THEREOF" and filed on Aug. 14, 2017, which is a continuation of and claims priority to U.S. patent application Ser. No. 15/059,652, titled "CONTACT STRUCTURE AND FORMATION THEREOF" and filed on Mar. 3, 2016, which is a divisional of and claims priority to U.S. patent application Ser. No. 14/091,508, titled "CONTACT STRUCTURE AND FORMATION THEREOF" and filed on Nov. 27, 2013. U.S. patent application Ser. No. 15/675,967, U.S. patent application Ser. No. 15/059,652, and U.S. patent application Ser. No. 14/091,508 are incorporated herein by reference.

BACKGROUND

Contacts are used to make electrical connections in a semiconductor device.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

Figure 1:
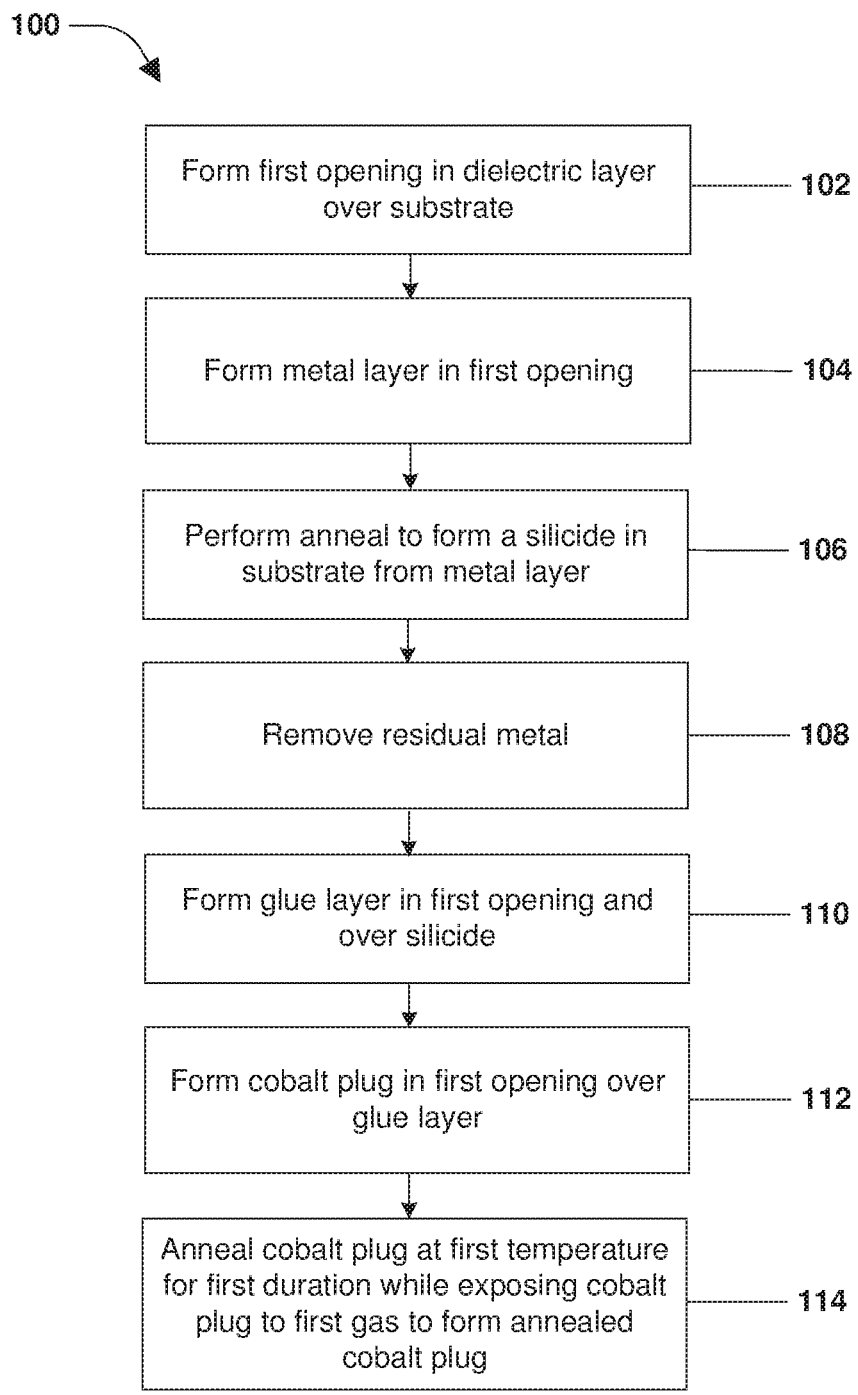
FIG. 1 is a flow diagram that illustrates a method of forming a semiconductor device, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

As provided herein, a cobalt plug is formed over a silicide in a first opening of a semiconductor device, where the cobalt plug is annealed to form an annealed cobalt plug, the annealed cobalt plug comprising a repaired lattice structure. According to some embodiments, the annealed cobalt plug is used as a contact to make an electrical connection within the semiconductor device, such as to electrically connect one or more features elements, etc. of the semiconductor device to one another. In some embodiments, the features, elements, etc. are separated by a dielectric layer and the annealed cobalt plug is formed within or passes through the dielectric layer to establish the electrical connection. In some embodiments, the annealed cobalt plug has low electric resistance, at least relative to a cobalt plug that is not so annealed, due to the repaired lattice structure. In some embodiments, the repaired lattice structure has at least one of less dislocation, a substantially uniform arrangement, or few to no seam-holes or voids, at least relative to a plug that is not so annealed. In some embodiments, a cobalt plug is formed without forming a nucleation layer. In some embodiments, a nucleation layer is not needed, such as between a silicide and the cobalt plug where such nucleation layer increases resistance between the silicide and the cobalt plug. In some embodiments, the first opening is formed within a dielectric layer, and the annealed cobalt plug is formed over a silicide in the first opening. In some embodiments, a glue layer is formed between the annealed cobalt plug and a sidewall of the dielectric layer defining the opening and between the annealed cobalt plug and the silicide. In some embodiments, a metal layer is formed between the annealed cobalt plug and a sidewall of the dielectric layer defining the opening. In some embodiments, the repaired lattice structure is a cobalt lattice structure. In some embodiments, the silicide is formed in a substrate before the first opening is formed, such that a first width of the first opening is less than a second width of the silicide.

According to some embodiments, a method of forming a semiconductor comprises forming a cobalt plug in a first opening over a silicide in a substrate, and annealing the cobalt plug at a first temperature for a first duration while exposing the cobalt plug to a first gas to form an annealed cobalt plug. In some embodiments, the first temperature is lower than would otherwise be needed with other metals to repair at least one of lattice dislocations, seam-holes or voids to form an annealed plug from such other metals. In some embodiments, the cobalt plug is formed using a cobalt precursor. In some embodiments, the cobalt precursor is an organic cobalt precursor. In some embodiments, the forming a cobalt plug comprises forming a cobalt lining in the first opening before forming a cobalt fill. In some embodiments, the forming a cobalt lining comprises physical vapor deposition (PVD). In some embodiments, the forming a cobalt plug comprises chemical vapor deposition (CVD). In some embodiments, the first temperature is between about 200° C. to about 800° C. In some embodiments, the first duration is between about 10 s to about 600 s. In some embodiments, the annealing alters the cobalt plug lattice structure such that at least one of the lattice is more homogenized, the lattice is more uniform, the lattice is more regular, voids are filled or seam-holes are filed.

Figure 8:
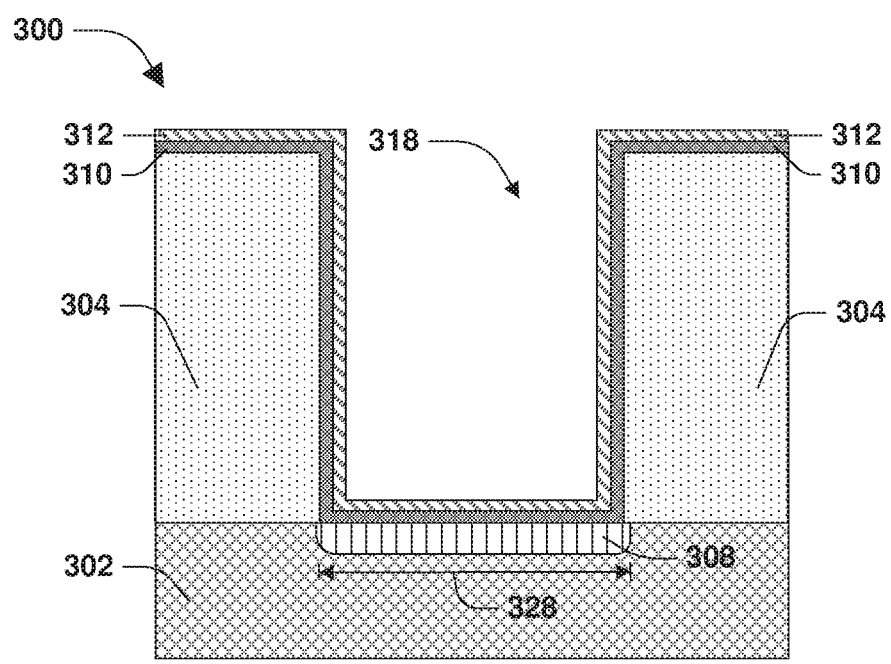
FIG. 8 illustrates a semiconductor device at a stage of fabrication, according to some embodiments.
Figure 9:
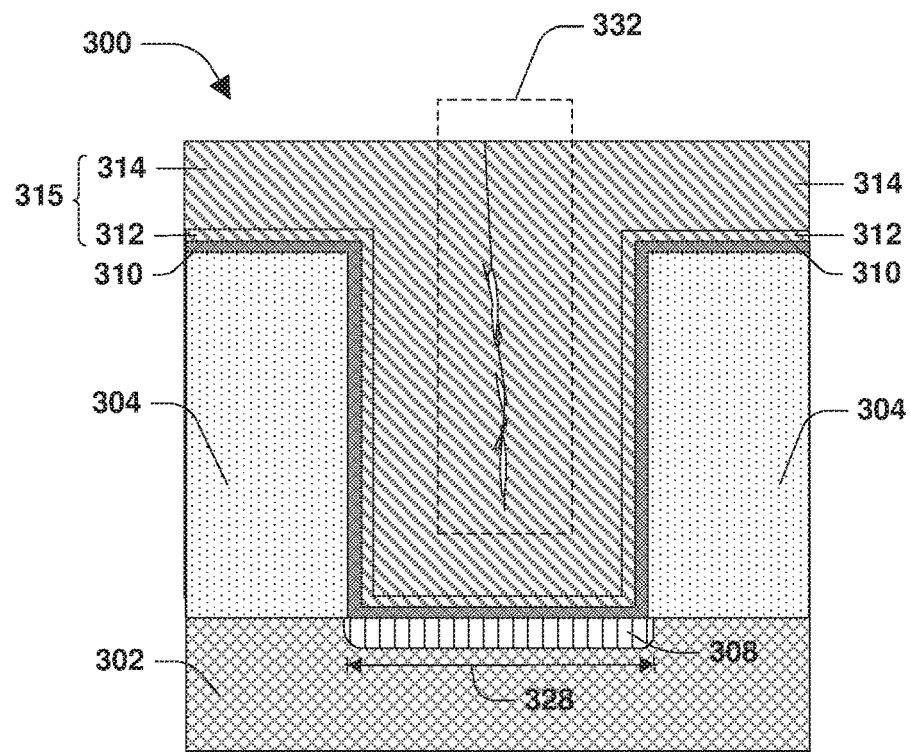
FIG. 9 illustrates a semiconductor device at a stage of fabrication, according to some embodiments.
Figure 10:
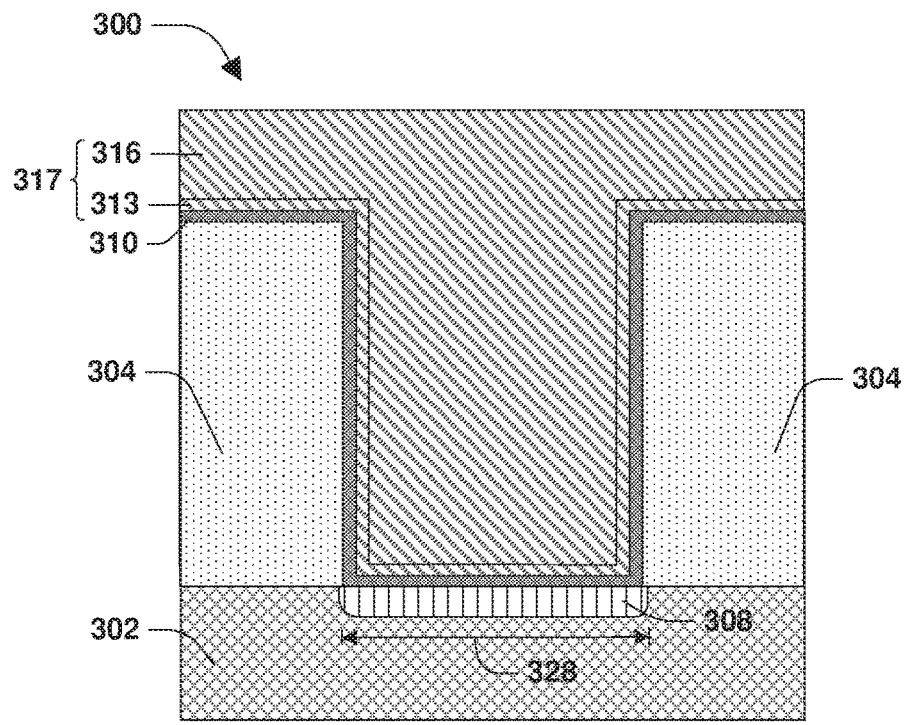
FIG. 10 illustrates a semiconductor device at a stage of fabrication, according to some embodiments.
Figure 12:
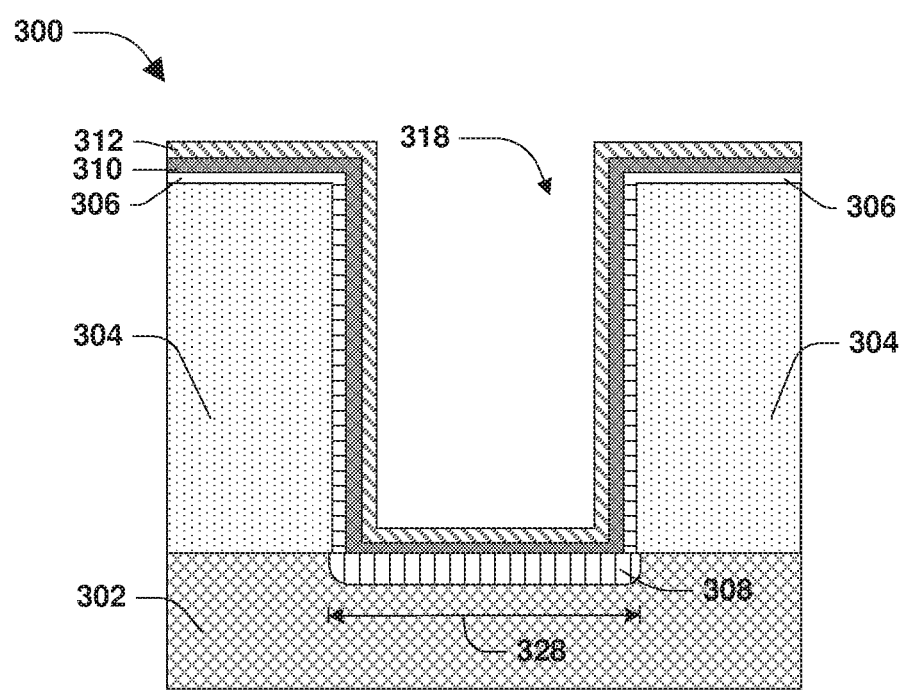
FIG. 12 illustrates a semiconductor device at a stage of fabrication, according to some embodiments.
Figure 13:
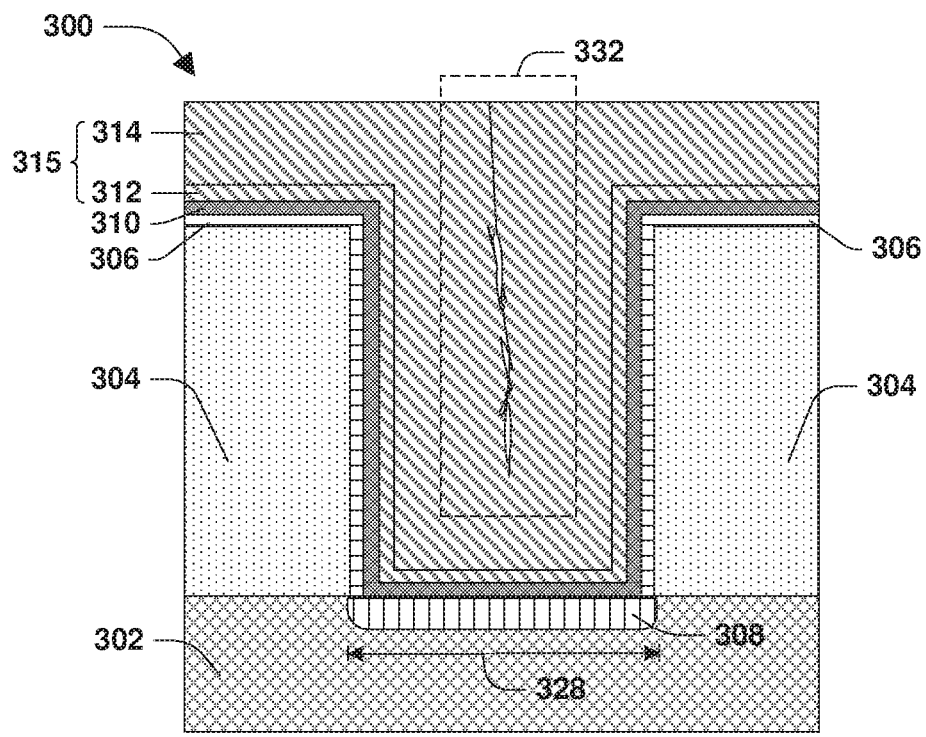
FIG. 13 illustrates a semiconductor device at a stage of fabrication, according to some embodiments.
Figure 14:
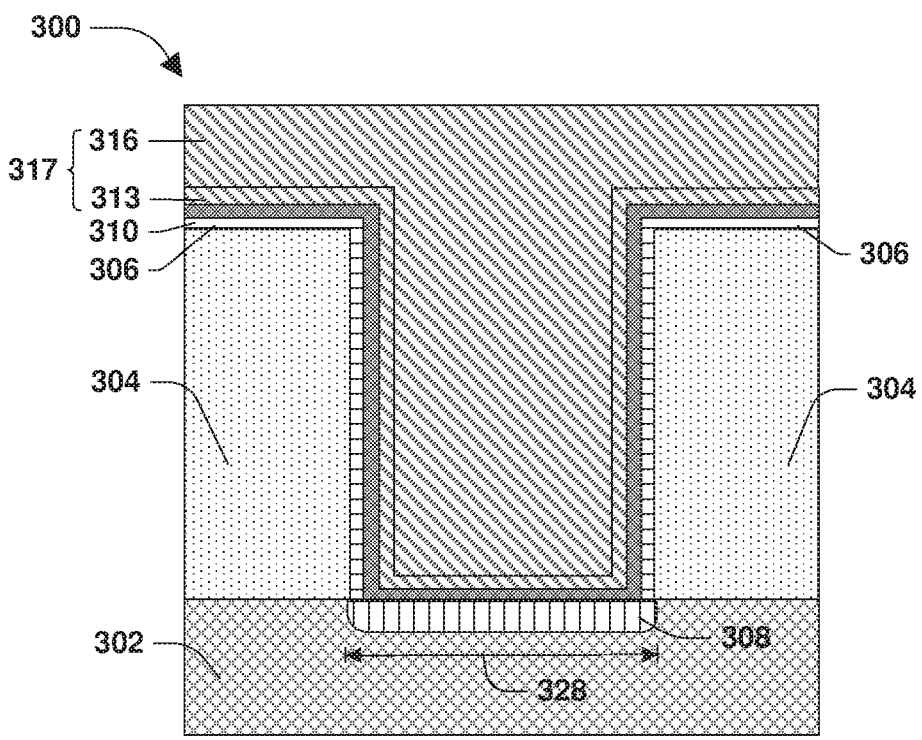
FIG. 14 illustrates a semiconductor device at a stage of fabrication, according to some embodiments.

A first method 100 of forming a first semiconductor device 300 is illustrated in FIG. 1, and one or more semiconductor arrangements formed by such methodology are illustrated in FIGS. 3-14. As illustrated in FIGS. 10 and 14, a first semiconductor device 300 comprises an annealed cobalt plug 317 over a silicide 308.

Figure 3:
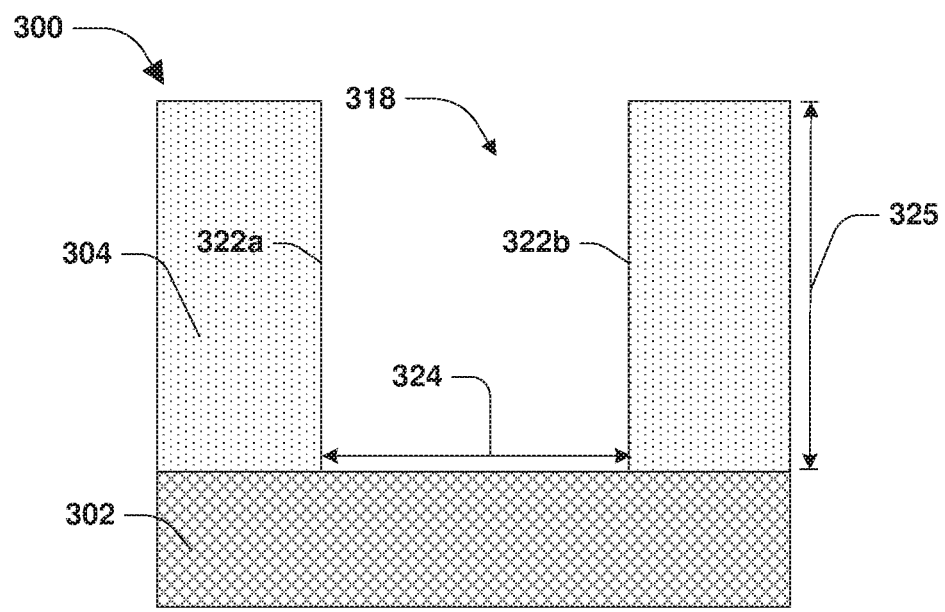
FIG. 3 illustrates a semiconductor device at a stage of fabrication, according to some embodiments.

At 102, a first opening 318 is formed in a dielectric layer 304 over a substrate 302, as illustrated in FIG. 3. In some embodiments, the first opening 318 is formed via etching, such as a contact dry etch. In some embodiments, the substrate 302 comprises at least one of Si, SiGe or SiP. In some embodiments, the substrate 302 comprises an epitaxial layer, a silicon-on-insulator (SOI) structure, a wafer, or a die formed from a wafer. In some embodiments, the dielectric layer 304 comprises at least one of a silicon oxide or a silicon nitride. In some embodiments, the first opening 318 has a first width 324. In some embodiments, the first width 324 is measured from opposing sidewalls 322a and 322b defining the first opening 318 of the dielectric layer 304. In some embodiments the first width 324 is between 10 µm to about 14 µm. In some embodiments, the first opening 318 has a first depth 325 as measured from a top surface of the dielectric layer 304 to a top surface of the substrate 302. In some embodiments, the first depth 325 is between 750 Å to about 1,250 Å. In some embodiments, a cleaning operation is performed after the first opening 318 is formed. In some embodiments, the cleaning comprises sputtering, such as argon sputtering.

Figure 4:
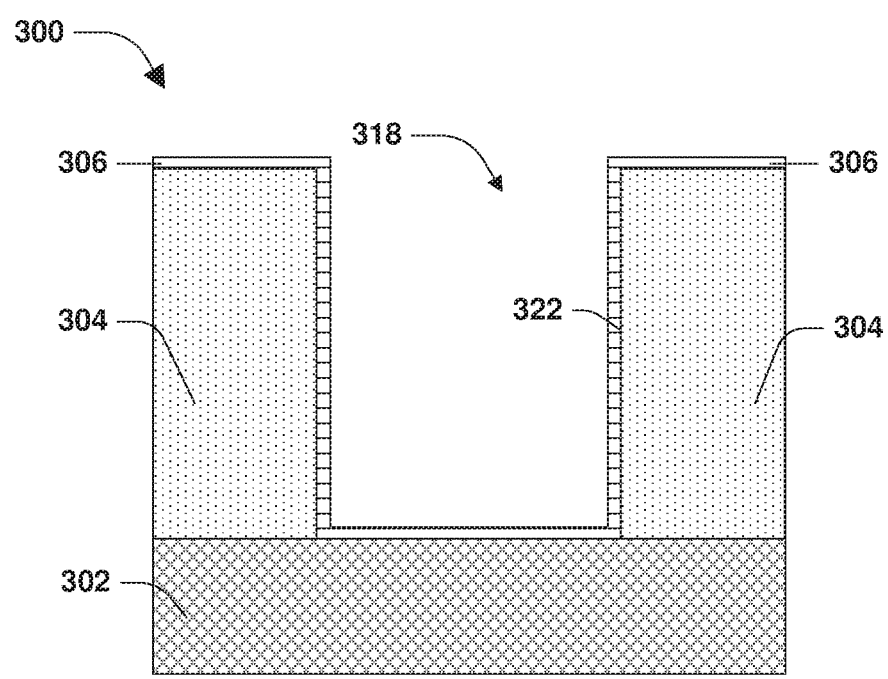
FIG. 4 illustrates a semiconductor device at a stage of fabrication, according to some embodiments.

At 104, a metal layer 306 is formed in the first opening 318, as illustrated in FIG. 4. In some embodiments, the metal layer 306 comprises at least one of nickel (Ni), titanium (Ti), titanium nitride TiN, platinum (Pt), erbium (Er) or Ytterbium (Yb). In some embodiments, the metal layer 306 has thickness between about 5 Å to about 300 Å. In some embodiments, the metal layer 306 comprises TiN or Ti and has a thickness between about 5 Å to about 100 Å. In some embodiments, the metal layer 306 is formed using at least one of physical vapor deposition (PVD), chemical vapor deposition (CVD) or atomic layer deposition (ALD).

Figure 5:
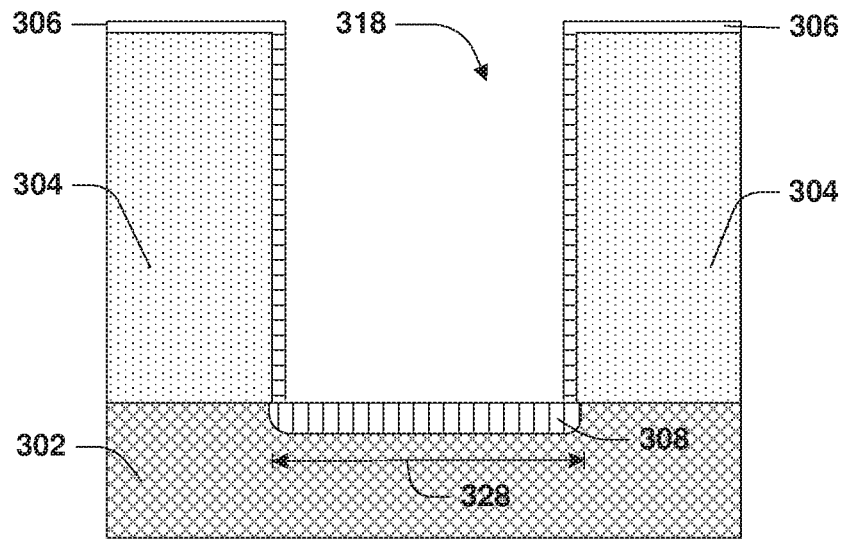
FIG. 5 illustrates a semiconductor device at a stage of fabrication, according to some embodiments.

At 106, an anneal is performed to form a silicide 308 in the substrate 302 from the metal layer 306, as illustrated in FIG. 5. In some embodiments, the metal layer 306 and the substrate 302 are at least one of annealed at a temperature between about 200° C. to about 800° C. or annealed for between about 1ms to about 60 s. In some embodiments, the silicide 308 has a thickness of between about 50 Å to about 150 Å. In some embodiments, the silicide 308 has a third width 328 of between about 10 µm to about 14 µm.

Figure 6:
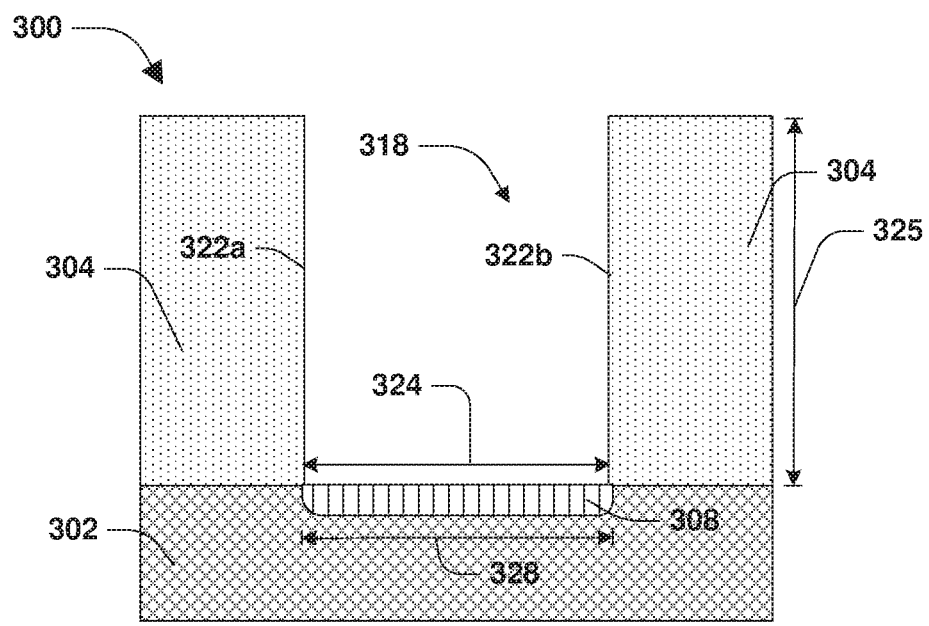
FIG. 6 illustrates a semiconductor device at a stage of fabrication, according to some embodiments.

At 108, residual or unsilicided portions of metal layer 306 are removed, such as from the sidewall 322 of the dielectric layer 304 defining the first opening 318, as illustrated in FIG. 6. In some embodiments, the metal layer 306 is removed from the sidewall 322 by etching, such as a selective etch using at least one of sulfuric-acid peroxide mixture (SPM), a hydrogen peroxide mixture (HPM) or an ammonia peroxide mixture (APM). In some embodiments, a cleaning process is performed after the residual or unsilicided portions of metal layer 306 are removed. In some embodiments, the cleaning comprises sputtering, such as argon sputtering.

Figure 7:
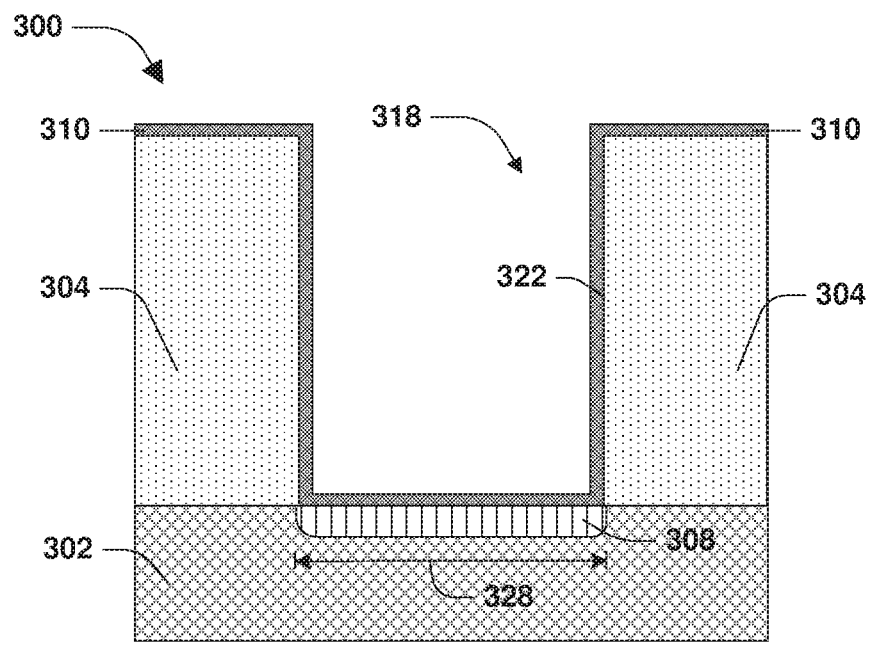
FIG. 7 illustrates a semiconductor device at a stage of fabrication, according to some embodiments.
Figure 11:
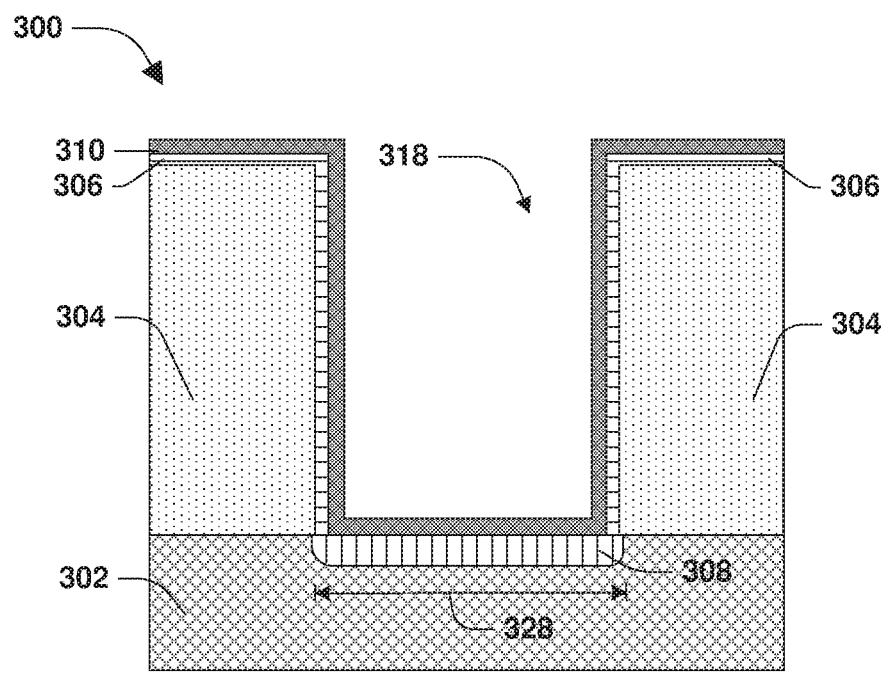
FIG. 11 illustrates a semiconductor device at a stage of fabrication, according to some embodiments.

At 110, a glue layer 310 is formed in the first opening 318 and over the silicide 308, as illustrated in FIG. 7. In some embodiments, residual or unsilicided portions of the metal layer 306 are not removed and the glue layer 310 is formed over such portions of the metal layer 306 and the silicide 308, as illustrated in FIG. 11. In some embodiments, the glue layer 310 comprises TiN. In some embodiments, the glue layer 310 is formed using at least one of PVD, CVD, or ALD. In some embodiments, the glue layer 310 has a thickness between about 5 Å to about 200 Å. In some embodiments, the glue layer 310 is optional.

At 112, a cobalt plug 315 is formed in the first opening over the glue layer 310, as illustrated in FIGS. 9 and 13. In some embodiments, the cobalt plug 315 is formed over residual portions of the metal layer 306, where such residual portions were not removed and the glue layer 310 was omitted. In some embodiments, the formation of the cobalt plug 315 comprises the formation of a cobalt lining 312 over the glue layer 310, as illustrated in FIGS. 8 and 12, then the formation of a cobalt fill 314 in the first opening 318 over the cobalt lining 312 as illustrated in FIGS. 9 and 13. In some embodiments, the formation of the cobalt plug 315 comprises the formation of the cobalt fill 314 over the glue layer 310 in the first opening 318, not illustrated. In some embodiments, the cobalt lining 312 is formed using at least one of ALD or PVD. In some embodiments, the cobalt lining 312 is formed in a chamber. In some embodiments, the cobalt lining 312 is formed at a pressure in the chamber of between about 1 mTorr to about 1000 mTorr. In some embodiments, the cobalt lining 312 is formed in the presence of a first gas, the first gas comprising at least one of Ar, $H_2$ or $N_2$. In some embodiments, the cobalt lining 312 is formed by introducing the first gas into a chamber at a first flow rate. In some embodiments, the first flow rate is between 1sccm to about 1000 sccm. In some embodiments, the cobalt lining 312 is formed using a bias voltage. In some embodiments, the bias voltage is between about 0V to about 1000V. In some embodiments, the cobalt lining 312 has a thickness between about 5 Å to about 200 Å. In some embodiments, the cobalt lining 312 is formed using cobalt precursors, such as an organic cobalt precursor. In some embodiments, the cobalt fill 314 is formed using CVD. In some embodiments, the cobalt fill 314 is formed in a chamber. In some embodiments the cobalt lining 312 and the cobalt fill 314 are formed in the same chamber. In some embodiments, the cobalt fill 314 is formed at a first pressure between about 0.5 Torr to about 760 Torr in the chamber. In some embodiments, the cobalt fill 314 is formed in the presence of the first gas, the first gas comprising at least one of Ar, $H_2$, $N_2$, He or $NH_3$. In some embodiments, the cobalt fill 314 is formed by introducing the first gas into a chamber at a first flow rate between 1 sccm to about 1000 sccm. In some embodiments, the cobalt fill 314 is formed at a formation temperature. In some embodiments, the formation temperature is between about 50° C. to about 500° C. In some embodiments, the cobalt fill 314 is formed using a cobalt precursor, such as organic cobalt precursors. In some embodiments, the cobalt precursor comprises at least one of cyclopentadienyl cobalt dicarbonyl ($CpCo(CO)_2$), Dicobalt hexacarbonyl tert-butylacetylene (CCTBA: $C_{12}H_{10}O_6(Co)_2$), bis(cyclopentadienyl) cobalt ($Co(C_5H_5)_2$, $CpCo(CO)_2$), bis (ethylcyclopentadienyl)cobalt ($C_{14}H_{18}Co$), bis (ethylcyclopentadienyl)cobalt ($C_{14}H_{18}Co$), bis (pentamethylcyclopentadienyl)cobalt ($C_{20}H_{30}Co$), or Cobalt tris(2,2,6,6-tetramethyl-3,5-heptanedionate) (Co $(OCC(CH_3)_3CHCOC(CH_3)_3)_3$). In some embodiments, the cobalt plug 315 comprises a lattice structure that is damaged, such as by at least one of dislocations, voids or seam-holes 332. In some embodiments, at least one of a void or a seam-hole 332 is defined by an area within the cobalt plug 315 where an air pocket is formed and as a result, the cobalt lattice is not at least one of uniform or regular.

At 114, the cobalt plug 315 is annealed at a first temperature for a first duration while exposing the cobalt plug 315 to the first gas to form an annealed cobalt plug 317, as illustrated in FIGS. 10 and 14. In some embodiments, the cobalt plug 315 is annealed in a chamber. In some embodiments, the cobalt plug 315 is annealed at a first pressure between about 0.5 Torr to about 760 Torr in the chamber. In some embodiments, the cobalt plug 315 is annealed in the presence of the first gas. In some embodiments, the first gas comprises at least one of Ar, $H_2$, $N_2$, He or $NH_3$. In some embodiments, the cobalt plug 315 is annealed at a first temperature between about 200° C. to about 800° C. In some embodiments, the cobalt plug 315 is annealed for a first duration. In some embodiments, the first duration is between about 10 s to about 600 s. In some embodiments, the cobalt plug 315 is annealed by introducing the first gas into a chamber at a first flow rate. In some embodiments, the first flow rate is between 1sccm to about 1000 sccm. In some embodiments, the annealed cobalt plug 317 comprises an annealed cobalt liner 313. In some embodiments, the annealed cobalt plug 317 comprises a repaired lattice structure 316. In some embodiments, the repaired lattice structure is a repaired cobalt lattice structure. In some embodiments, the annealed cobalt plug 317 has few to no voids or seam-holes 332 and as a result, the cobalt lattice is substantially uniform or regular. In some embodiments, the annealing of the cobalt plug 315 homogenizes the cobalt lattice structure by softening the cobalt during the annealing and allowing movement of cobalt atoms to remove or repair dislocations in the cobalt lattice structure. In some embodiments, the annealing relieves internal stress on the cobalt lattice structure by repairing irregularities, such as at least one of the voids or seam-holes 332. In some embodiments, the annealed cobalt plug 317 has at least one of an increased conductivity or decreased resistance as a result of the at least one of a reduced dislocations or reduced irregularities in the repaired lattice structure.

In some embodiments, a second cobalt layer is added over the annealed cobalt plug 317, not illustrated.

Figure 2:
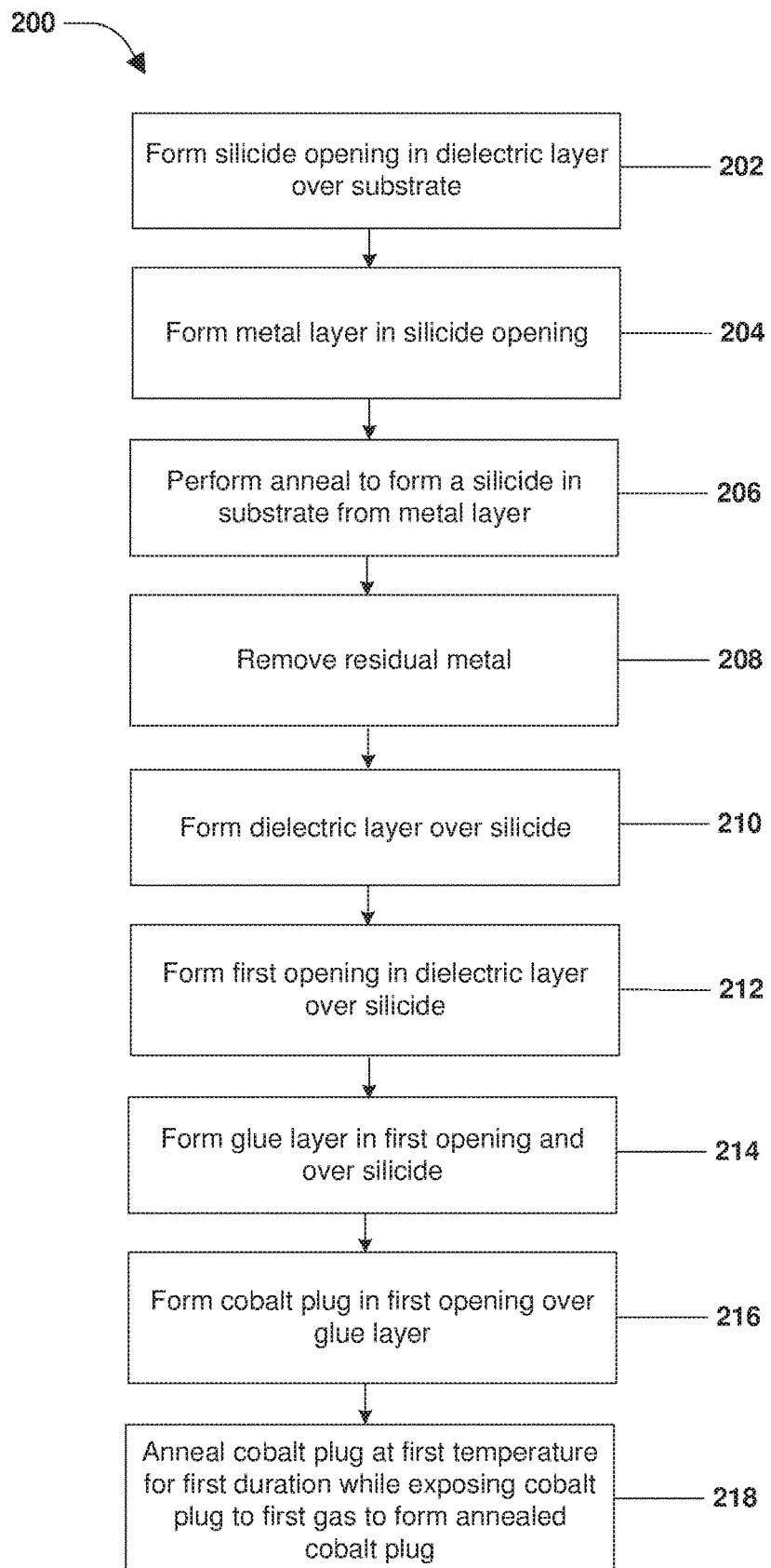
FIG. 2 is a flow diagram that illustrates a method of forming a semiconductor device, according to some embodiments.
Figure 24:
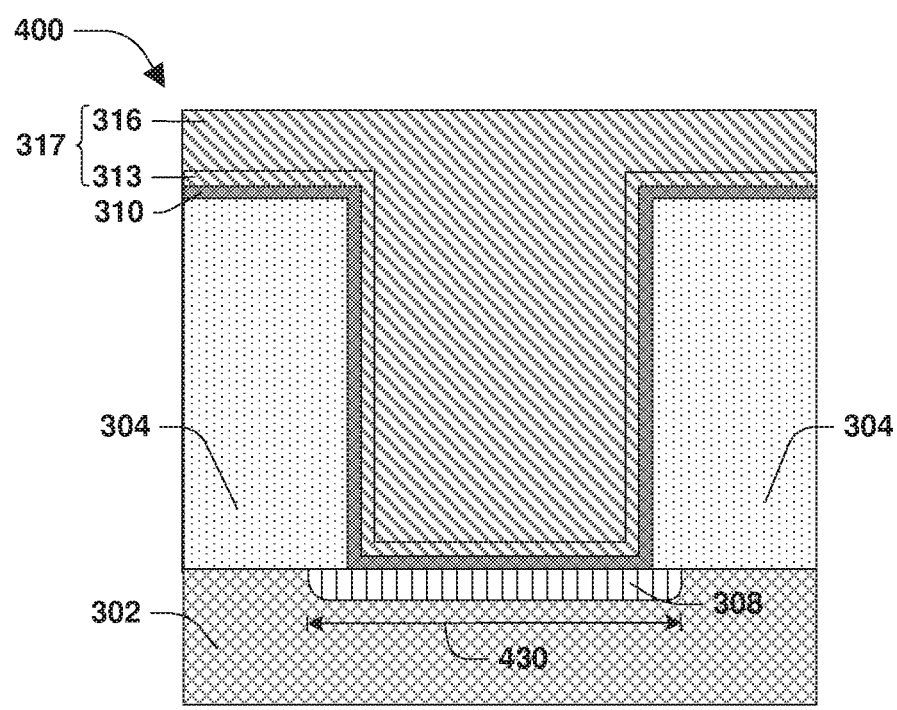
FIG. 24 illustrates a semiconductor device at a stage of fabrication, according to some embodiments.
Figure 33:
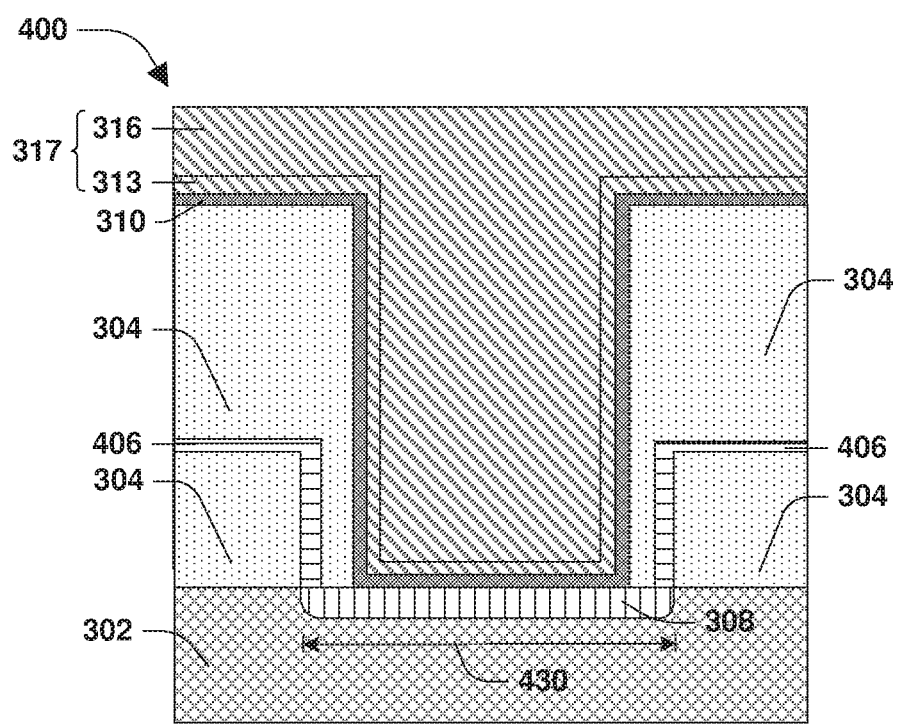
FIG. 33 illustrates a semiconductor device at a stage of fabrication, according to some embodiments.

A second method 200 of forming a second semiconductor device 400 is illustrated in FIG. 2, and one or more semiconductor arrangements formed by such methodology are illustrated in FIGS. 15-33. As illustrated in FIGS. 24 and 33, a second semiconductor device 400 comprises an annealed cobalt plug 317 over a silicide 308.

Figure 15:
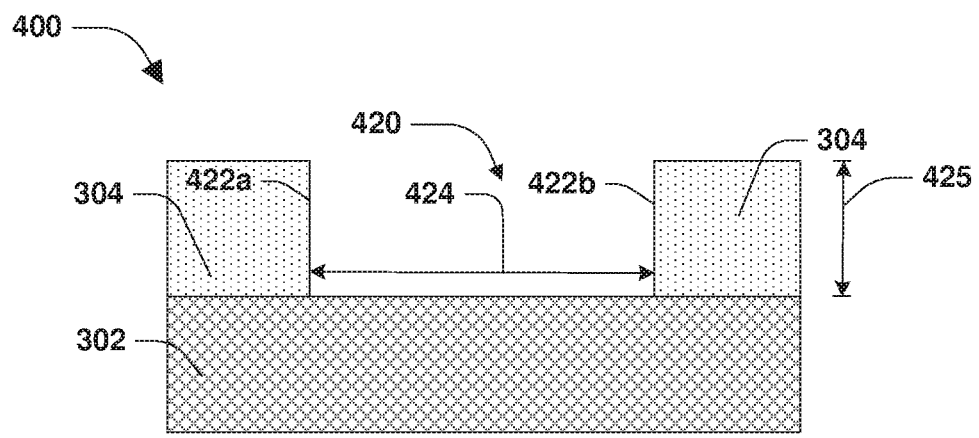
FIG. 15 illustrates a semiconductor device at a stage of fabrication, according to some embodiments.
Figure 25:
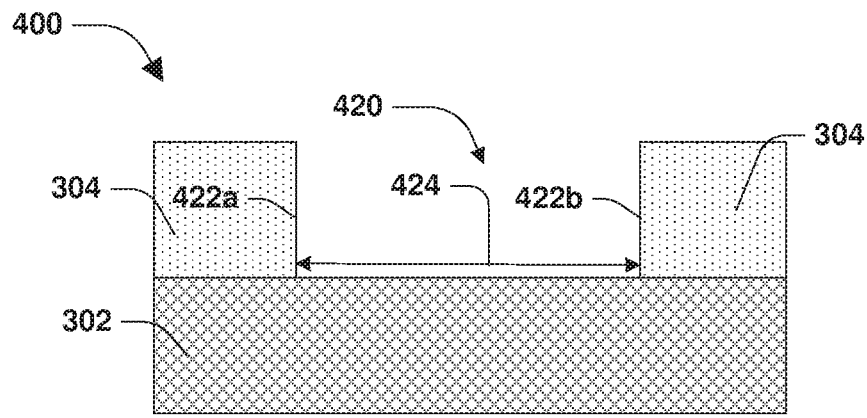
FIG. 25 illustrates a semiconductor device at a stage of fabrication, according to some embodiments.

At 202, a silicide opening 420 is formed in a dielectric layer 304 over a substrate 302, as illustrated in FIGS. 15 and 25. In some embodiments, the substrate comprises at least one of Si, SiGe or SiP. In some embodiments, the substrate 302 comprises an epitaxial layer, a silicon-on-insulator (SOI) structure, a wafer, or a die formed from a wafer. In some embodiments, the dielectric layer 304 comprises at least one of a silicon oxide or a silicon nitride. In some embodiments, the silicide opening 420 is formed by etching, such as by a contact dry etch. In some embodiments, the silicide opening 420 has a silicide opening width 424. In some embodiments, the silicide opening width 424 is measured from opposing sidewalls 422a and 422b defining the first opening 318 of the dielectric layer 304. In some embodiments the silicide opening width 424 is between 10 µm to about 20 µm. In some embodiments, the silicide opening 420 has a silicide depth 425 as measured from a top surface of the dielectric layer 304 to a top surface of the substrate 302. In some embodiments, the silicide depth 425 is between 750 Å to about 1,250 Å. In some embodiments, a cleaning operation is performed after the silicide opening 420 is formed. In some embodiments, the cleaning comprises sputtering, such as argon sputtering.

Figure 16:
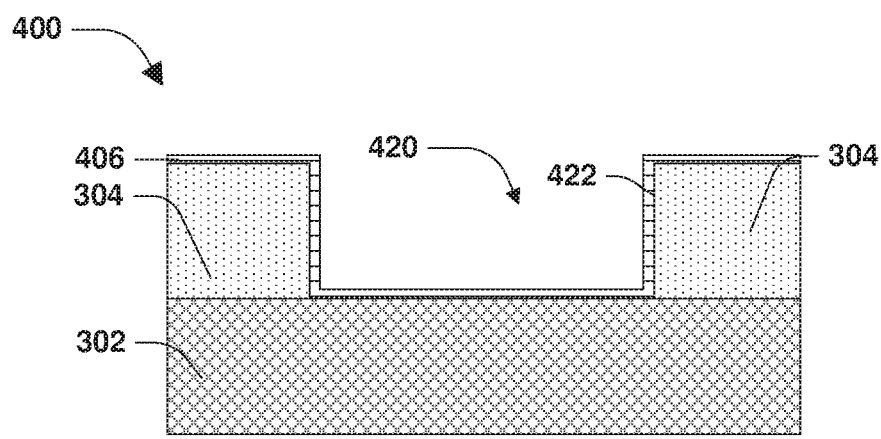
FIG. 16 illustrates a semiconductor device at a stage of fabrication, according to some embodiments.
Figure 26:
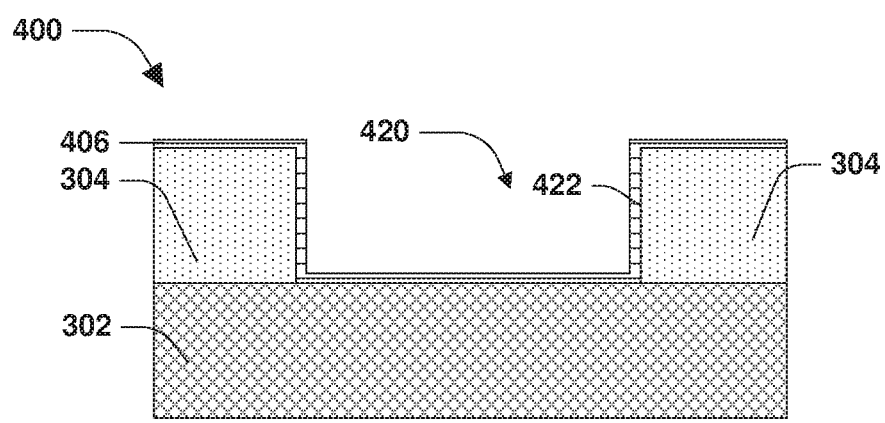
FIG. 26 illustrates a semiconductor device at a stage of fabrication, according to some embodiments.

At 204, a metal layer 306 is formed in the silicide opening 420, as illustrated in FIGS. 16 and 26. In some embodiments, the metal layer 406 comprises at least one of nickel (Ni), titanium (Ti), titanium nitride TiN, platinum (Pt), erbium (Er) or Ytterbium (Yb). In some embodiments, the metal layer 406 has thickness between about 5 Å to about 300 Å. In some embodiments, the metal layer 406 comprises TiN or Ti and has a thickness between about 5 Å to about 100 Å. In some embodiments, the metal layer 406 is formed using at least one of physical vapor deposition (PVD), chemical vapor deposition (CVD) or atomic layer deposition (ALD).

Figure 17:
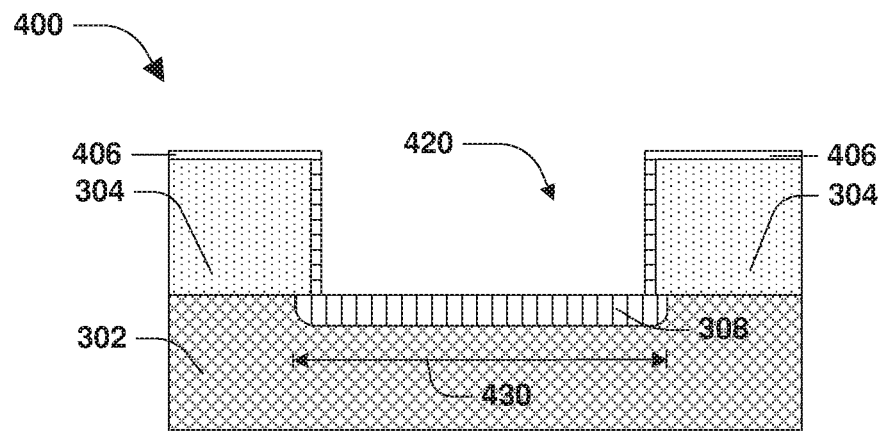
FIG. 17 illustrates a semiconductor device at a stage of fabrication, according to some embodiments.
Figure 27:
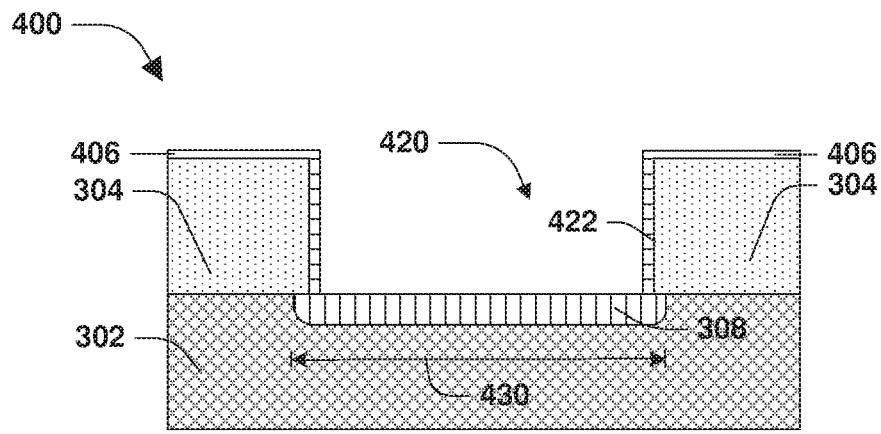
FIG. 27 illustrates a semiconductor device at a stage of fabrication, according to some embodiments.

At 206, an anneal is performed to form a silicide 308 in the substrate 302 from the metal layer 406, as illustrated in FIGS. 17 and 27. In some embodiments, the metal layer 406 and the substrate 302 are at least one of annealed at a temperature between about 200° C. to about 800° C. or annealed for between about 1ms to about 60 s. In some embodiments, the silicide has a thickness of between about 50 Å to about 150 Å. In some embodiments, the silicide 308 has a second width 430 of between about 10 µm to about 20 µm.

Figure 18:
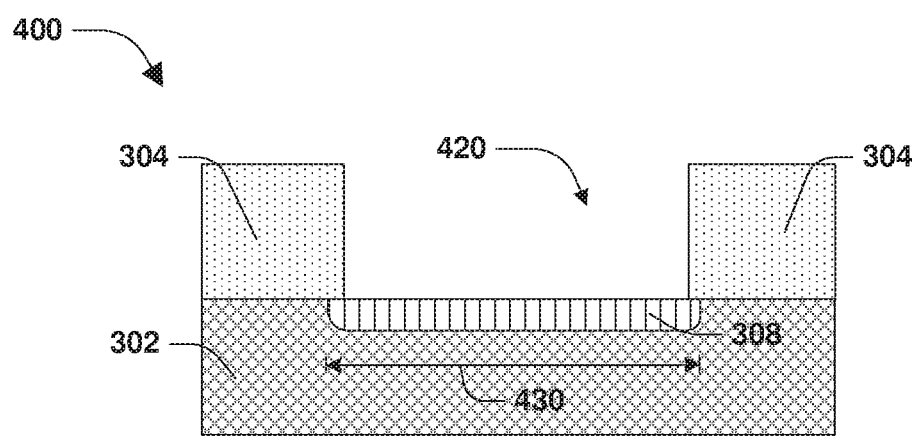
FIG. 18 illustrates a semiconductor device at a stage of fabrication, according to some embodiments.

At 208, residual or unsilicided portions of metal layer 406 are removed, such as from the sidewall 422 of the dielectric layer 304 defining the silicide opening 420, as illustrated in FIG. 18. In some embodiments, the metal layer 406 is removed from the sidewall 422 by etching, such as a selective etch using at least one of sulfuric-acid peroxide mixture (SPM), a hydrogen peroxide mixture (HPM) or an ammonia peroxide mixture (APM). In some embodiments, a cleaning process is performed after the residual metal is removed. In some embodiments, the cleaning comprises sputtering, such as argon sputtering.

Figure 19:
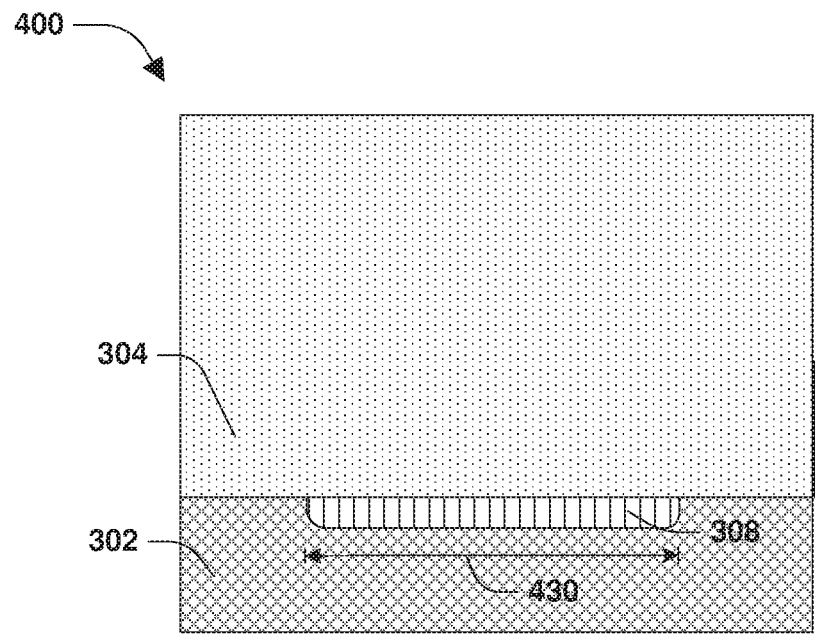
FIG. 19 illustrates a semiconductor device at a stage of fabrication, according to some embodiments.
Figure 28:
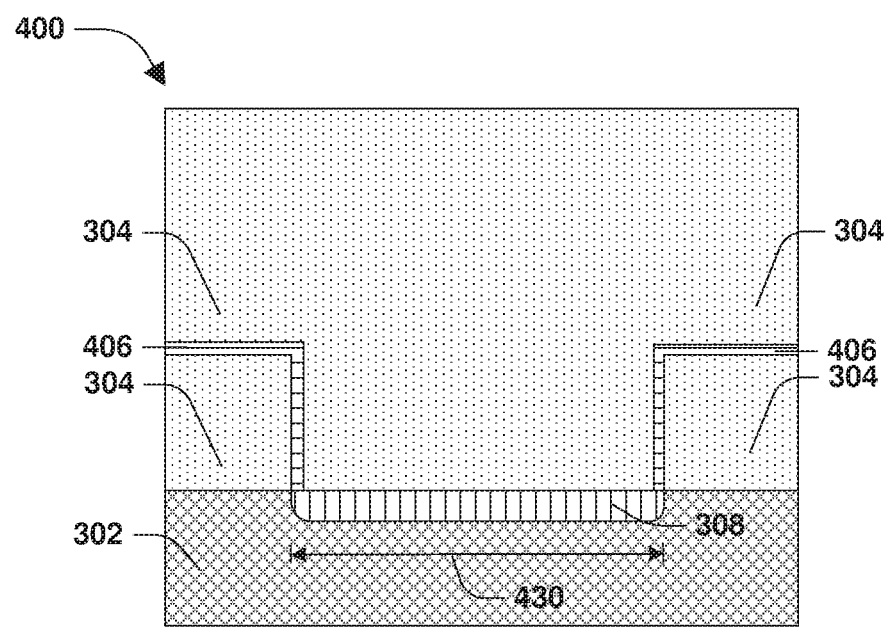
FIG. 28 illustrates a semiconductor device at a stage of fabrication, according to some embodiments.

At 210, a dielectric layer 304 is formed over the silicide opening 420, as illustrated in FIGS. 19 and 28. In some embodiments, residual or unsilicided portions of the metal layer 406 are not removed, as illustrated in FIG. 28. In some embodiments, the dielectric layer 304 is formed over the residual or unsilicided portions of the metal layer 406, as illustrated in FIG. 28. In some embodiments, the dielectric layer 304 comprises at least one of a silicon oxide or a silicon nitride. In some embodiments, the dielectric layer 304 formation comprises deposition. In some embodiments, excess dielectric layer 304, such as dielectric layer 304 that exceeds a certain height, or is uneven is removed, such as by chemical mechanical polishing (CMP).

Figure 20:
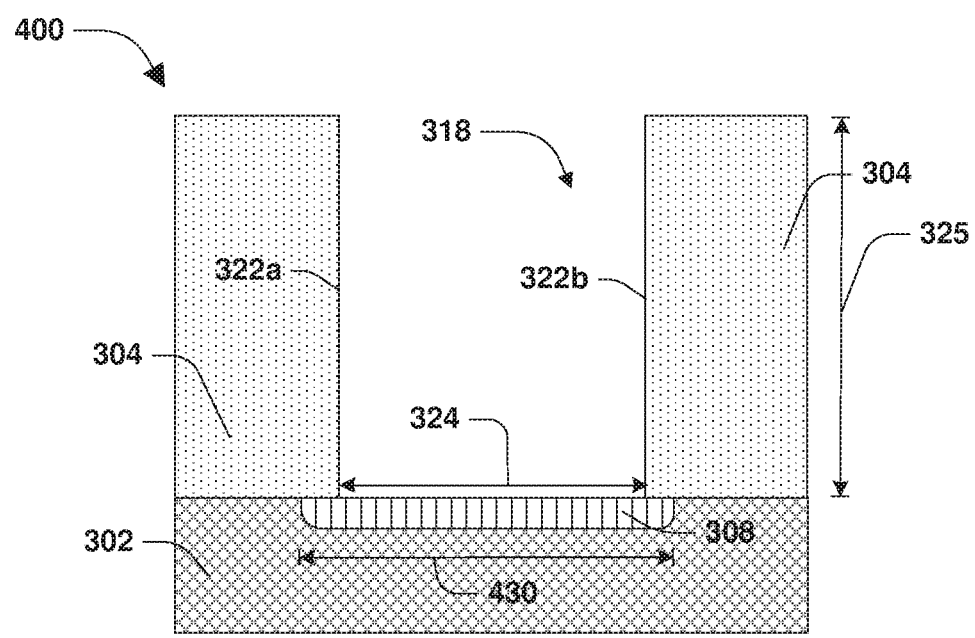
FIG. 20 illustrates a semiconductor device at a stage of fabrication, according to some embodiments.
Figure 29:
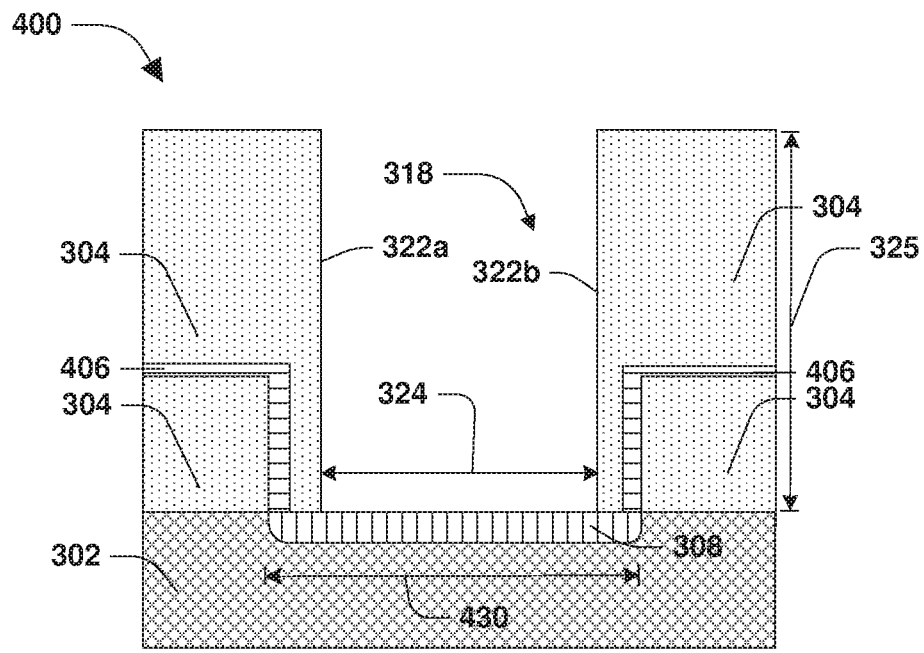
FIG. 29 illustrates a semiconductor device at a stage of fabrication, according to some embodiments.

At 212, a first opening 318 is formed in a dielectric layer 304 over the silicide 308, as illustrated in FIGS. 20 and 29. In some embodiments, the first opening 318 is formed via etching, such as a contact dry etch. In some embodiments, the first opening 318 extends through the dielectric layer 304 to the silicide 308. In some embodiments, the first opening 318 has a first width 324. In some embodiments, the first width 324 is measured from opposing sidewalls 322a and 322b defining the first opening 318 of the dielectric layer 304. In some embodiments the first width is between 10 μm to about 14 μm. In some embodiments, the first opening 318 has a first depth 225 as measured from a top surface of the dielectric layer 304 to a top surface of the substrate 302. In some embodiments, the first depth 325 is between 750 Å to about 1,250 Å. In some embodiments, the first width 324 is less than the silicide opening width 424. In some embodiments, the second width 430 of the silicide 308 is greater than the first width 324. In some embodiments, a cleaning operation is performed after the first opening 318 is formed. In some embodiments, the cleaning comprises sputtering, such as argon sputtering.

Figure 21:
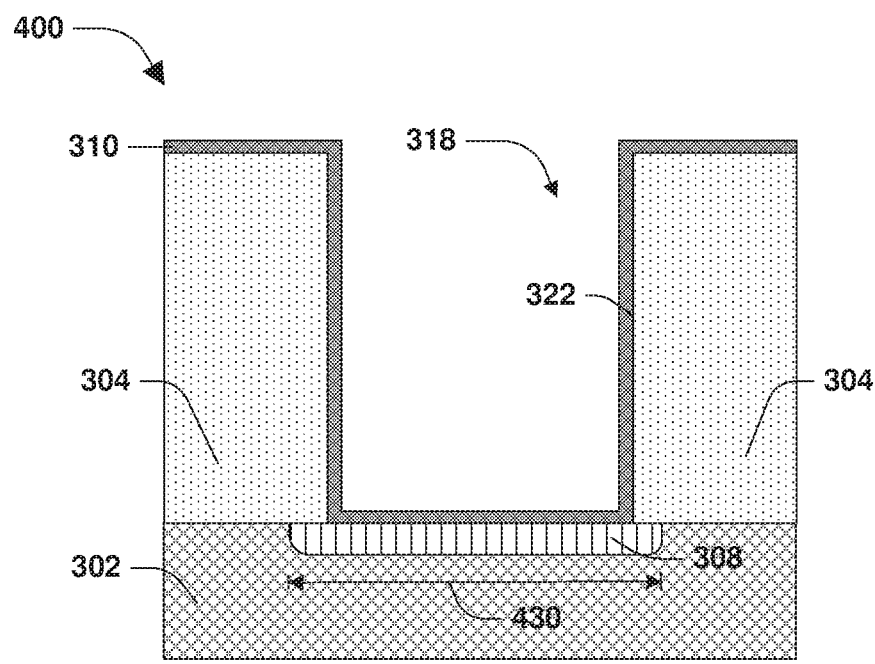
FIG. 21 illustrates a semiconductor device at a stage of fabrication, according to some embodiments.
Figure 22:
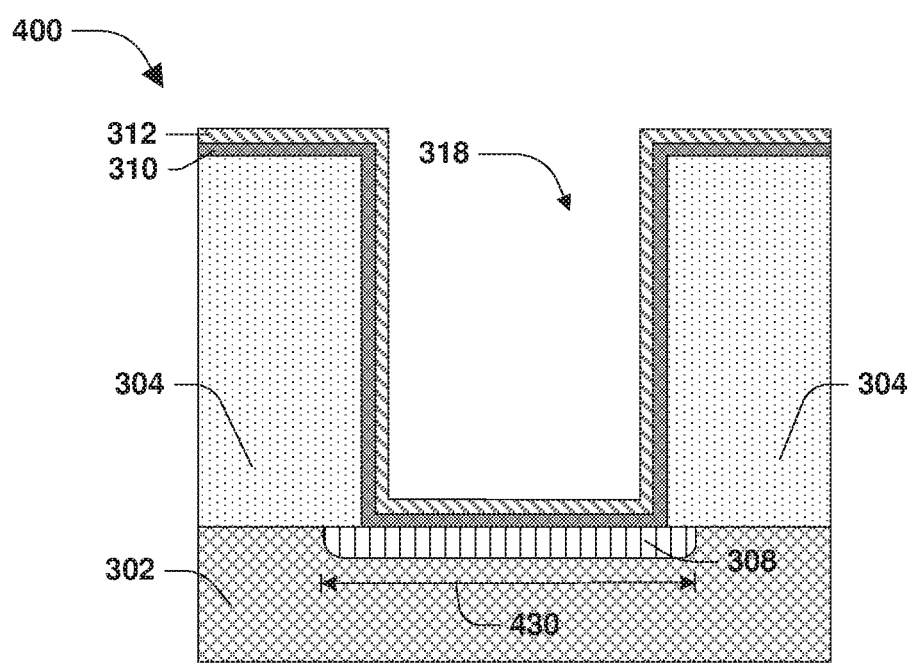
FIG. 22 illustrates a semiconductor device at a stage of fabrication, according to some embodiments.
Figure 23:
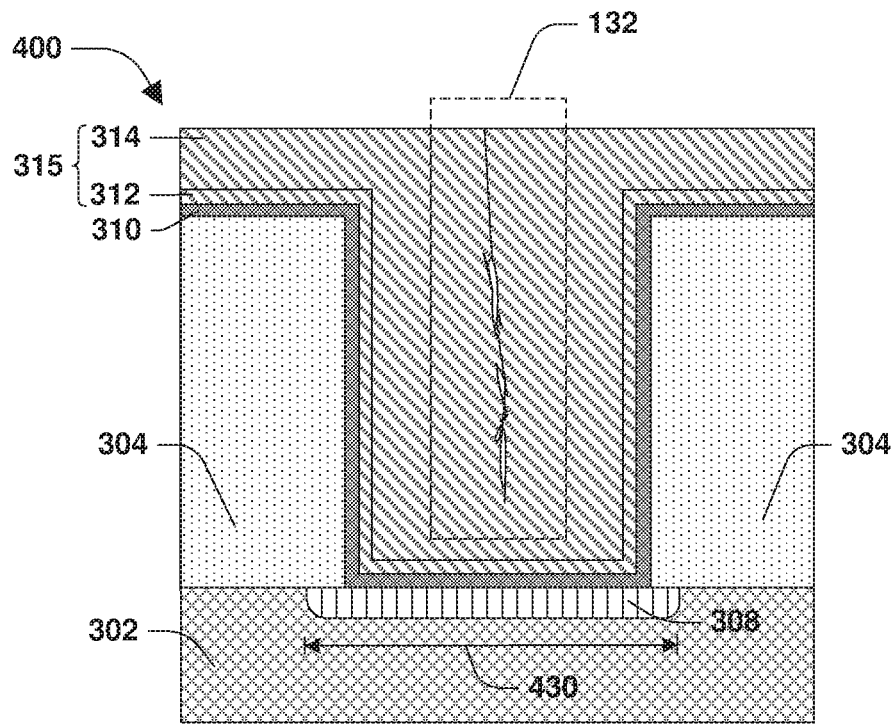
FIG. 23 illustrates a semiconductor device at a stage of fabrication, according to some embodiments.
Figure 30:
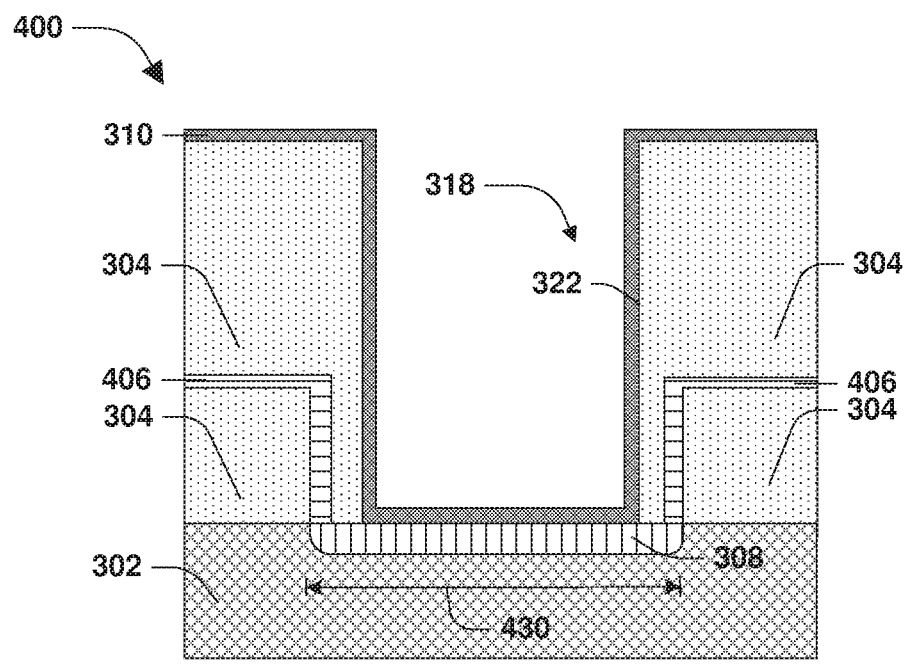
FIG. 30 illustrates a semiconductor device at a stage of fabrication, according to some embodiments.
Figure 31:
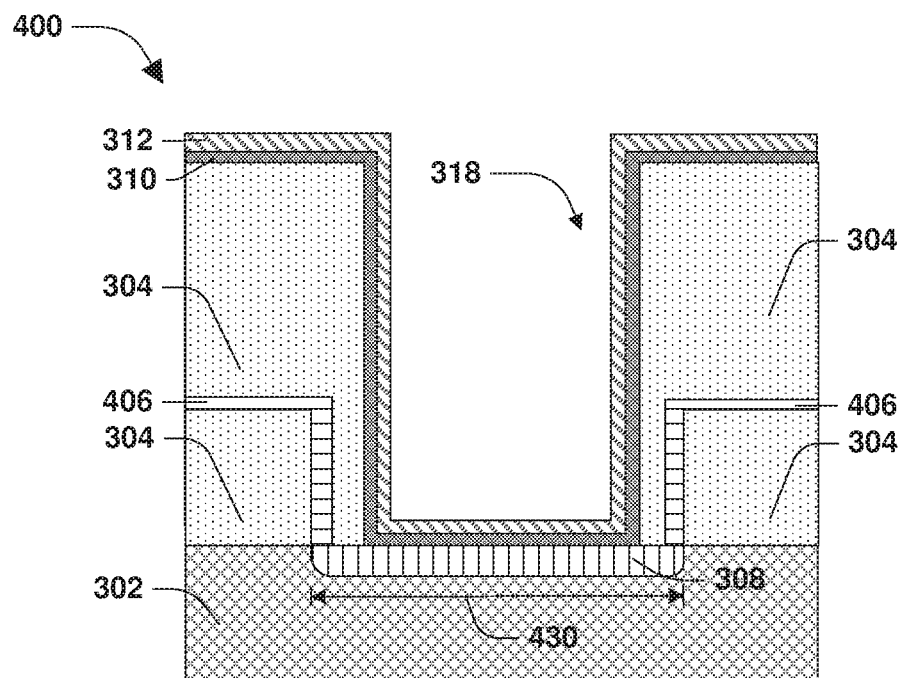
FIG. 31 illustrates a semiconductor device at a stage of fabrication, according to some embodiments.
Figure 32:
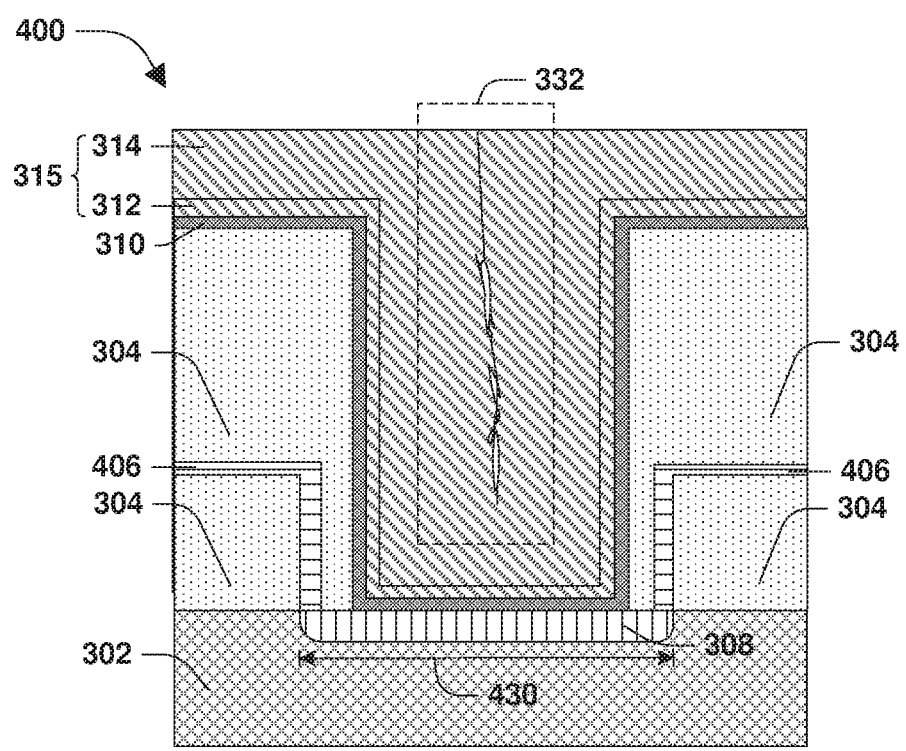
FIG. 32 illustrates a semiconductor device at a stage of fabrication, according to some embodiments.

At 214, a glue layer 310 is formed in the first opening 318 and over the silicide 308, as illustrated in FIGS. 21 and 30. In some embodiments, the glue layer 310 is formed as described above with regard to the glue layer 310, such as illustrated in FIG. 7.

At 216, a cobalt plug 315 is formed in the first opening 318 over the glue layer 310, as illustrated in FIGS. 22-23 and 31-32. In some embodiments, the cobalt plug 315 is formed as described above with regard to the cobalt plug 315, such as illustrated in FIGS. 8-9.

At 218, the cobalt plug 315 is annealed at a first temperature for a first duration while exposing the cobalt plug 315 to the first gas to form an annealed cobalt plug 317, as illustrated in FIGS. 24 and 33. In some embodiments, the annealed cobalt plug 317 is formed as described above with regard to the annealed cobalt plug 317, such as illustrated in FIGS. 10 and 14.

In some embodiments, a second cobalt layer is added over the annealed cobalt plug 317, not illustrated.

According to some embodiments a method of forming a semiconductor device comprises forming a cobalt plug in a first opening over a silicide in a substrate and annealing the cobalt plug at a first temperature for a first duration while exposing the cobalt plug to a first gas to form an annealed cobalt plug.

According to some embodiments a semiconductor device comprises an annealed cobalt plug over a silicide in a first opening of the semiconductor device, the annealed cobalt plug comprising a repaired lattice structure.

According to some embodiments a method of forming a semiconductor device comprises forming a cobalt plug in a first opening over a silicide in a substrate and annealing the cobalt plug at a first temperature between about 200° C. to about 800° C. for a duration between about 10 s to about 600 s while exposing the cobalt plug to a first gas comprising at least one of Ar, $H_2$, $N_2$, He or $NH_3$ to form an annealed cobalt plug.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
   a silicide;
   a dielectric layer;
   a glue layer in contact with a first sidewall of the dielectric layer, a second sidewall of the dielectric layer, and a top surface of the silicide;
   a metal layer laterally co-planar with the glue layer, wherein the glue layer is spaced apart from the metal layer; and
   a cobalt plug over the silicide, wherein:
      the glue layer is between the silicide and the cobalt plug, and
      the cobalt plug has a different composition than the metal layer.

2. The semiconductor device of claim 1, wherein the glue layer is a titanium nitride layer.

3. The semiconductor device of claim 1, wherein the dielectric layer overlies the silicide.

4. The semiconductor device of claim 1, wherein the cobalt plug is in contact with the glue layer.

5. The semiconductor device of claim 1, wherein the dielectric layer is in contact with the top surface of the silicide.

6. The semiconductor device of claim 1, wherein the dielectric layer is between the silicide and the glue layer.

7. The semiconductor device of claim 1, wherein the silicide is disposed within a substrate and the dielectric layer overlies the substrate.

8. The semiconductor device of claim 1, wherein the silicide comprises nickel.

9. The semiconductor device of claim 1, wherein the dielectric layer is between the metal layer and the glue layer.

10. A semiconductor device, comprising:
    a silicide;
    a metal layer;
    a first dielectric layer overlying the silicide;
    a glue layer overlying the silicide and between a first portion of the first dielectric layer and a second portion of the first dielectric layer, wherein the first dielectric layer is between the metal layer and the glue layer; and
    a cobalt plug over the silicide, wherein:
       the glue layer is between the silicide and the cobalt plug, and
       the cobalt plug has a different composition than the metal layer.

11. The semiconductor device of claim 10, comprising:
    a second dielectric layer, wherein the metal layer is between the first dielectric layer and the second dielectric layer.

12. The semiconductor device of claim 10, wherein the metal layer contacts the silicide.

13. The semiconductor device of claim 10, wherein the glue layer contacts the silicide.

14. The semiconductor device of claim 10, wherein the silicide comprises nickel.

15. A semiconductor device, comprising:
    a silicide;
    a metal layer overlying the silicide;
    a dielectric layer;
    a glue layer overlying the silicide, wherein:
       the glue layer is in contact with a sidewall of the dielectric layer, and
       the glue layer is spaced apart from the metal layer; and
    a cobalt plug overlying the silicide, wherein:
       the glue layer is between the silicide and the cobalt plug, and
       the glue layer is between the metal layer and the cobalt plug.

16. The semiconductor device of claim 15, wherein the glue layer is in contact with a top surface of the silicide.

17. The semiconductor device of claim 15, wherein the glue layer contacts a top surface of the dielectric layer.

18. The semiconductor device of claim 15, wherein a width of the silicide is greater than a width of a portion of the glue layer between a first portion of the dielectric layer and a second portion of the dielectric layer.

19. The semiconductor device of claim 15, wherein the metal layer is in contact with a surface of the silicide.

20. The semiconductor device of claim 15, wherein:
    the glue layer, the dielectric layer, and the metal layer are in contact with a top surface of the silicide.

* * * * *